United States Patent
Hikosaka et al.

(10) Patent No.: US 12,142,646 B2
(45) Date of Patent: Nov. 12, 2024

(54) NITRIDE SEMICONDUCTOR, SEMICONDUCTOR DEVICE, AND METHOD FOR MANUFACTURING NITRIDE SEMICONDUCTOR

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Toshiki Hikosaka, Kawasaki (JP); Hajime Nago, Yokohama (JP); Jumpei Tajima, Mitaka (JP); Shinya Nunoue, Ichikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 464 days.

(21) Appl. No.: 17/650,575

(22) Filed: Feb. 10, 2022

(65) Prior Publication Data

US 2023/0046560 A1      Feb. 16, 2023

(30) Foreign Application Priority Data

Aug. 16, 2021   (JP) ................. 2021-132234

(51) Int. Cl.
*H01L 29/36*     (2006.01)
*H01L 21/02*     (2006.01)
(Continued)

(52) U.S. Cl.
CPC ........ *H01L 29/36* (2013.01); *H01L 21/02381* (2013.01); *H01L 21/02458* (2013.01);
(Continued)

(58) Field of Classification Search
CPC .............. H01L 29/36; H01L 21/02381; H01L 21/02458; H01L 21/0254; H01L 21/0262;
(Continued)

(56) References Cited

U.S. PATENT DOCUMENTS 9,269,799 B2      2/2016  Ishiguro et al.
10,636,899 B2 *   4/2020  Curatola ............... H01L 29/205
2016/0064488 A1   3/2016  Takado et al.

FOREIGN PATENT DOCUMENTS

JP    2004-039766 A    2/2004
JP    2012-243886 A    12/2012
(Continued)

*Primary Examiner* — David Vu
(74) *Attorney, Agent, or Firm* — Oblon, McClelland, Maier & Neustadt, L.L.P.

(57) ABSTRACT

According to one embodiment, a nitride semiconductor includes a base body, a nitride member, and an intermediate region provided between the base body and the nitride member. The nitride member includes a first nitride region including $Al_{x1}Ga_{1-x1}N$ ($0<x1\leq1$), and a second nitride region including $Al_{x2}Ga_{1-x2}N$ ($0\leq x2<1$, $x2<x1$). The first nitride region is between the intermediate region and the second nitride region. The intermediate region includes nitrogen and carbon. A concentration of carbon in the intermediate region is not less than $1.5\times10^{19}/cm^3$ and not more than $6\times10^{20}/cm^3$.

20 Claims, 5 Drawing Sheets

(51) Int. Cl.
 *H01L 29/20* (2006.01)
 *H01L 29/205* (2006.01)
 *H01L 29/778* (2006.01)

(52) U.S. Cl.
 CPC ...... *H01L 21/0254* (2013.01); *H01L 21/0262* (2013.01); *H01L 29/2003* (2013.01); *H01L 29/205* (2013.01); *H01L 29/7786* (2013.01)

(58) Field of Classification Search
 CPC ............... H01L 29/2003; H01L 29/205; H01L 29/7786; H01L 21/02505; H01L 21/02579; H01L 29/207; H01L 29/41766; H01L 29/4236; H01L 29/66462
 See application file for complete search history.

(56) References Cited

FOREIGN PATENT DOCUMENTS

| | | |
|---|---|---|
| JP | 2014-220407 A | 11/2014 |
| JP | 2017-168862 A | 9/2017 |

* cited by examiner

NITRIDE SEMICONDUCTOR, SEMICONDUCTOR DEVICE, AND METHOD FOR MANUFACTURING NITRIDE SEMICONDUCTOR

CROSS-REFERENCE TO RELATED APPLICATIONS

This application is based upon and claims the benefit of priority from Japanese Patent Application No. 2021-132234, filed on Aug. 16, 2021; the entire contents of which are incorporated herein by reference.

FIELD

Embodiments described herein generally relate to a nitride semiconductor, a semiconductor device and a method for manufacturing a nitride semiconductor.

BACKGROUND

For example, a semiconductor device is manufactured using a wafer including a nitride semiconductor. Suppression of warpage is desired.

DETAILED DESCRIPTION

Figure 1:
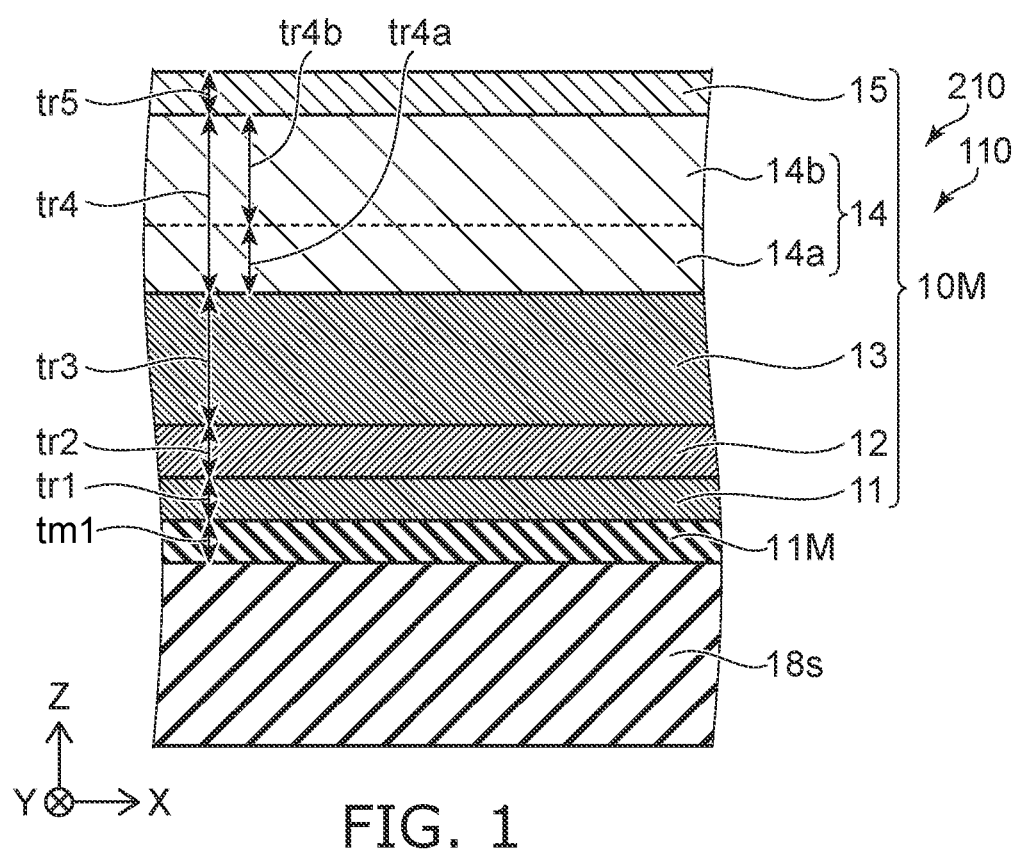
FIG. 1 is a schematic cross-sectional view illustrating a nitride semiconductor according to a first embodiment.

According to one embodiment, a nitride semiconductor includes a base body, a nitride member, and an intermediate region provided between the base body and the nitride member.

The nitride member includes a first nitride region including $Al_{x1}Ga_{1-x1}N$ (0<x1≤1), and a second nitride region including $Al_{x2}Ga_{1-x2}N$ (0≤x2<1, x2<x1). The first nitride region is between the intermediate region and the second nitride region.

The intermediate region includes nitrogen and carbon. A concentration of carbon in the intermediate region is not less than $1.5 \times 10^{19}/cm^3$ and not more than $6 \times 10^{20}/cm^3$.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a nitride semiconductor according to a first embodiment.

As shown in FIG. 1, the nitride semiconductor 110 according to the embodiment includes a base body 18s, a nitride member 10M, and an intermediate region 11M. The intermediate region 11M is provided between the base body 18s and the nitride member 10M. A wafer 210 includes a nitride semiconductor 110.

The base body 18s includes, for example, silicon. The base body 18s is, for example, a silicon substrate.

The nitride member 10M includes a first nitride region 11 and a second nitride region 12. The first nitride region 11 is provided between the intermediate region 11M and the second nitride region 12.

The nitride member 10M may include a third nitride region 13, a fourth nitride region 14, a fifth nitride region 15, and the like. The fourth nitride region 14 and the fifth nitride region 15 correspond to a functional layer. The third nitride region 13, the fourth nitride region 14, and the fifth nitride region 15 are provided as necessary and may be omitted. At least one of the third nitride region 13, the fourth nitride region 14, and the fifth nitride region 15 may be considered to be included in the second nitride region 12.

The first nitride region 11 includes $Al_{x1}Ga_{1-x1}N$ (0<x1≤1). The composition ratio x1 of Al in the first nitride region 11 is, for example, not less than 0.35 and not more than 1. In one example, the first nitride region 11 includes AlN.

The second nitride region 12 includes $Al_{x2}Ga_{1-x2}N$ (0≤x2<1, x2<x1). For example, the second nitride region 12 includes AlGaN or GaN.

A direction from the first nitride region 11 to the second nitride region 12 is defined as a first direction. The first direction is a Z-axis direction. One direction perpendicular to the Z-axis direction is defined as an X-axis direction. The direction perpendicular to the Z-axis direction and the X-axis direction is defined as a Y-axis direction.

The base body 18s, the intermediate region 11M, the first nitride region 11 and the second nitride region 12 are layered along the X-Y plane.

For example, the intermediate region 11M is in contact with the base body 18s. For example, the intermediate region 11M is in contact with the first nitride region 11. For example, the first nitride region 11 is in contact with the second nitride region 12.

For example, at least a part of the intermediate region 11M may include aluminum. For example, at least a part of the intermediate region 11M may include silicon.

The intermediate region 11M includes nitrogen and carbon. A concentration of carbon in the intermediate region 11M is not less than $1.5 \times 10^{19}/cm^3$ and not more than $6 \times 10^{20}/cm^3$. The concentration of carbon in the intermediate region 11M may be not less than $3 \times 10^{19}/cm^3$ and not more than $4 \times 10^{20}/cm^3$.

It has been found that by providing such an intermediate region 11M, warpage can be suppressed in the nitride semiconductor 110 (for example, the wafer 210).

Figure 2:
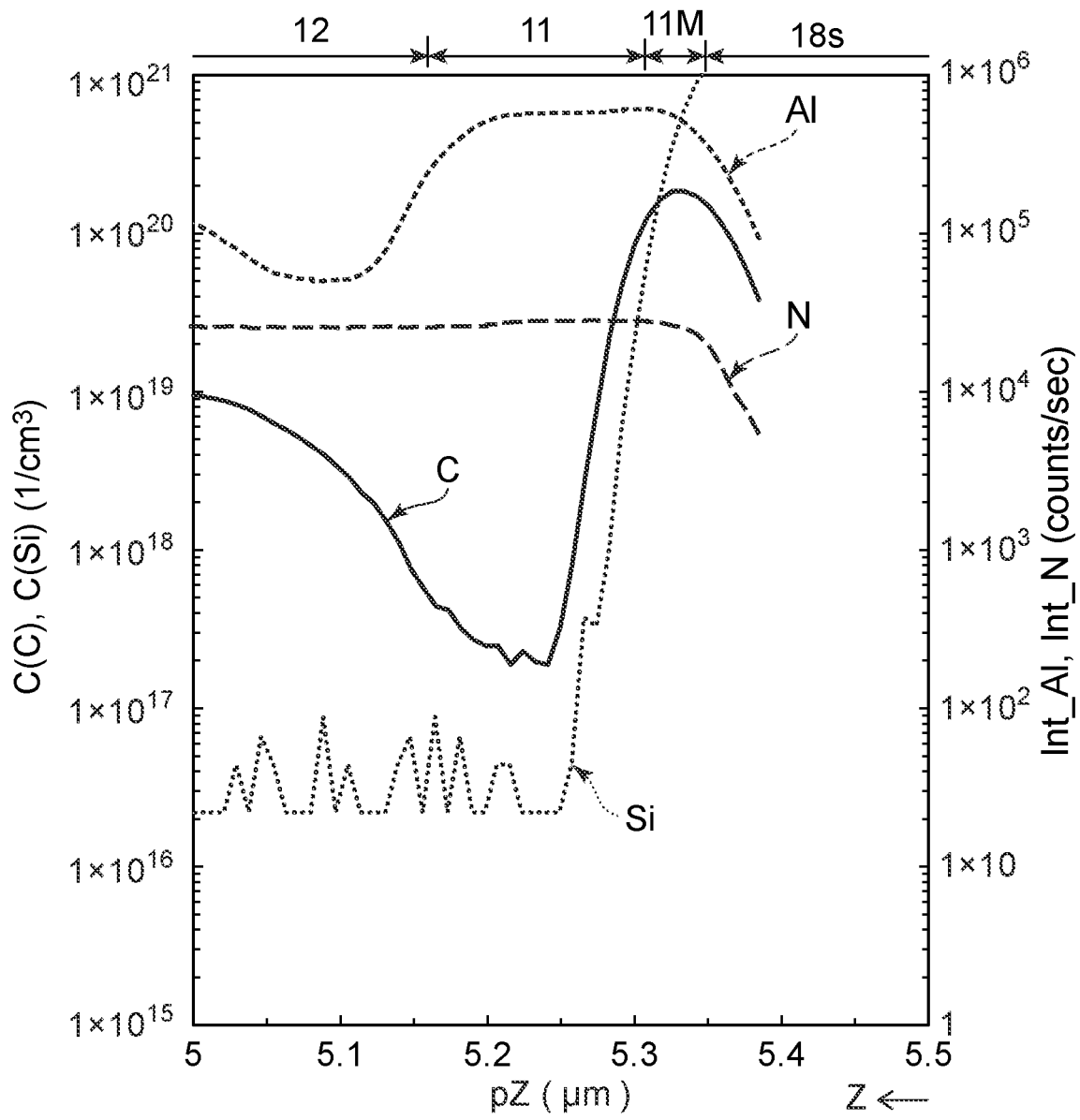
FIG. 2 is a graph illustrating the nitride semiconductor according to the first embodiment.

FIG. 2 is a graph illustrating the nitride semiconductor according to the first embodiment.

FIG. 2 illustrates the results of SIMS (Secondary Ion Mass Spectrometry) analysis of the nitride semiconductor 110. In FIG. 2, the horizontal axis is the position pZ in the Z-axis direction. The vertical axis on the left side of FIG. 2 is the concentration of carbon C (C) or the silicon concentration C (Si). The vertical axis on the right side of FIG. 2 is the secondary ion strength Int_Al of Al or the secondary ion strength Int_N of N.

As shown in FIG. 2, the intermediate region 11M is provided between the base body 18s and the first nitride region 11. The intermediate region 11M includes carbon. The intermediate region 11M includes nitrogen. In this example, the intermediate region 11M includes aluminum and silicon. The base body 18s substantially does not include nitrogen. The intermediate region 11M, the first nitride region 11 and the second nitride region 12 include nitrogen.

As will be described later, such an intermediate region 11M is obtained by supplying a first gas including carbon to the base body 18s, then stopping the supply of the first gas including carbon, and supplying a second gas including nitrogen, and after that, forming the first nitride region 11 and the second nitride region 12.

The concentration of carbon C (C) in the intermediate region 11M can be controlled by, for example, the supply amount of the first gas including carbon. The concentration of carbon C (C) in the intermediate region 11M can also be controlled by, for example, a temperature of a heat treatment of the base body 18s. When the supply amount of the first gas is large, the concentration of carbon C (C) in the intermediate region 11M becomes high. When the heat treatment temperature is low, the concentration of carbon C (C) in the intermediate region 11M becomes high.

Hereinafter, an example of experimental results regarding the change in warpage when the concentration of carbon C (C) is changed will be described.

Figure 3:
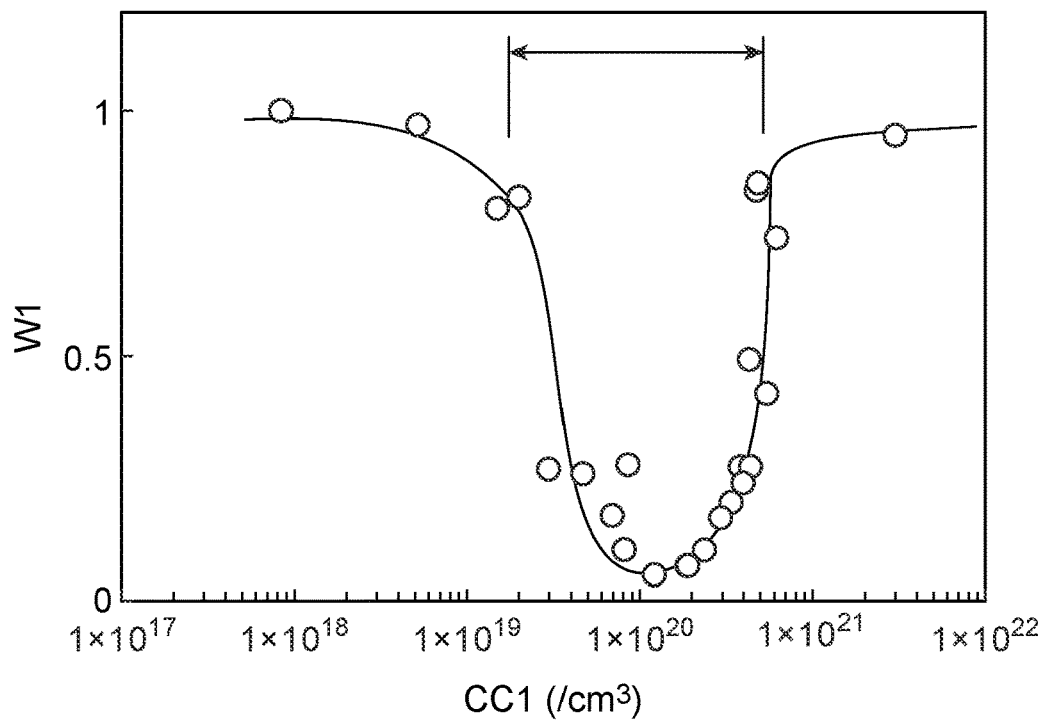
FIG. 3 is a graph illustrating the nitride semiconductor according to the first embodiment.

FIG. 3 is a graph illustrating the nitride semiconductor according to the first embodiment.

The horizontal axis of FIG. 3 is the concentration of carbon CC1 in the intermediate region 11M. The vertical axis of FIG. 3 is a warp amount W1 of the wafer 210. The warp amount W1 is standardized based on a warp amount when the intermediate region 11M is not provided (a first reference example). In the first reference example, the first nitride region 11 is in contact with the base body 18s. In this experimental example, the amount of warpage in the first reference example is about 170 μm.

As shown in FIG. 3, when the concentration of carbon CC1 in the intermediate region 11M is not less than $1.5 \times 10^{19}/cm^3$ and not more than $6 \times 10^{20}/cm^3$, the warp amount W1 is small. When the concentration of carbon CC1 is less than $1.5 \times 10^{19}/cm^3$, the warpage amount of W1 is large. When the concentration carbon CC1 exceeds $6 \times 10^{20}/cm^3$, the warpage amount W1 is large.

In the first reference example, the warp is caused by, for example, a stress generated between the base body 18s and the nitride member 10M. The stress is caused by, for example, a difference in the coefficient of thermal expansion between the base body 18s and the nitride member 10M.

Warpage can be suppressed when the concentration of carbon CC1 in the intermediate region 11M is not less than $1.5 \times 10^{19}/cm^3$ and not more than $6 \times 10^{20}/cm^3$. It is considered that the stress is relaxed by providing the intermediate region 11M having such a concentration of carbon CC1 between the base body 18s and the nitride member 10M. As a result, warpage can be suppressed.

As shown in FIG. 3, the characteristics of the concentration of carbon CC1 and the warp amount W1 in the intermediate region 11M are critical. The warpage amount W1 changes abruptly when the concentration of carbon CC1 is in the vicinity of about $1.5 \times 10^{19}/cm^3$. The warpage amount W1 changes abruptly when the concentration of carbon CC1 is in the vicinity of about $6 \times 10^{20}/cm^3$. As shown in FIG. 3, when the concentration of carbon CC1 in the intermediate region 11M is not less than $3 \times 10^{19}/cm^3$ and $4 \times 10^{20}/cm^3$, the warp amount W1 is smaller.

As shown in FIG. 2, for example, the first nitride region 11 substantially does not include carbon. Alternatively, the concentration of carbon C (C) in the first nitride region 11 is lower than the concentration of carbon C (C) in the intermediate region 11M. By the concentration of carbon C (C) in the first nitride region 11 being low, a defect density tends to be low, for example, in the nitride member 10M. For example, the strain applied to the second nitride region 12 becomes large. This reduces defects.

As shown in FIG. 2, for example, the second nitride region 12 includes carbon. The concentration of carbon C (C) in the second nitride region 12 is higher than the concentration of carbon C (C) in the first nitride region 11. By the second nitride region 12 including carbon, it is easy to obtain a low dislocation density in, for example, the nitride member 10M. For example, dislocations are easily bent in the second nitride region 12 including carbon. As a result, dislocations extending above the second nitride region 12 along the first direction (Z-axis direction) are reduced.

For example, the concentration of carbon C (C) in the second nitride region 12 is lower than the concentration of carbon C (C) in the intermediate region 11M. By the concentration of carbon C (C) in the second nitride region 12 being not excessively high, for example, the strain applied to the second nitride region 12 becomes large. For example, when the second nitride region 12 is formed, the strain applied to the second nitride region 12 is less likely to be relaxed. Thereby, the warpage control becomes easier.

As shown in FIG. 2, for example, the silicon concentration C (Si) in the first nitride region 11 is lower than the concentration of carbon C (C) in the first nitride region 11. For example, a ratio of the silicon concentration C (Si) in the first nitride region 11 to the concentration of carbon C (C) in the first nitride region 11 is not less than 0.0001 and not more than 0.01. By the silicon concentration C (Si) in the first nitride region 11 being low, for example, when the second nitride region 12 is formed, the strain applied to the second nitride region 12 is less likely to be relaxed. This makes it easier to control the warpage.

For example, the silicon concentration C (Si) in the second nitride region 12 is lower than the concentration of carbon C (C) in the second nitride region 12. For example, a ratio of the silicon concentration C (Si) in the second nitride region 12 to the concentration of carbon C (C) in the second nitride region 12 is not less than 0.0001 and not more than 0.1. When the silicon concentration C (Si) in the second nitride region 12 is low, for example, the strain applied to the second nitride region 12 is less likely to be relaxed. This makes it easier to control the warpage.

In the embodiment, a thickness of the intermediate region 11M (an intermediate region thickness tm1 (see FIG. 1)) is, for example, not less than 0.5 nm and not more than 100 nm.

A thickness of the first nitride region 11 (a first nitride region thickness tr1 (see FIG. 1)) is, for example, not less than nm and not more than 500 nm.

A thickness of the second nitride region 12 (a second nitride region thickness tr2 (see FIG. 1)) is, for example, not less than 50 nm and not more than 200 nm.

As shown in FIG. 1, the nitride member 10M may include the third nitride region 13. The third nitride region 13 includes, for example, $Al_{x3}Ga_{1-x3}N$ (0≤x3≤1). The third nitride region 13 includes, for example, AlGaN or GaN. As will be described later, the third nitride region 13 may have, for example, a stacked structure. A thickness of the third nitride region 13 (a third nitride region thickness tr3 (see FIG. 1)) is, for example, not less than 100 nm and not more than 8000 nm.

As shown in FIG. 1, as already described, the nitride member 10M may include the fourth nitride region 14 and the fifth nitride region 15. The fourth nitride region 14 includes $Al_{x4}Ga_{1-x4}N$ (0≤x4<1). The composition ratio x4 of Al in the fourth nitride region 14 is, for example, not less than 0 and not more than 0.5. The fourth nitride region 14 includes, for example, GaN. The composition ratio x4 of Al in the fourth nitride region 14 is lower than the composition ratio of Al in the third nitride region 13. A thickness of the fourth nitride region 14 (a fourth nitride region thickness tr4 (see FIG. 1)) is, for example, not less than 50 nm and not more than 5000 nm.

As shown in FIG. 1, the fourth nitride region 14 may include a first film region 14a and a second film region 14b. The first film region 14a is provided between the third nitride region 13 and the second film region 14b. The first film region 14a includes carbon. The second film region 14b does not include carbon. Alternatively, a concentration of carbon in the second film region 14b is lower than a concentration of carbon in the first film region 14a. By providing the first film region 14a including carbon, for example, a low dislocation density can be easily obtained. By the second film region 14b having a low concentration of carbon, for example, high electron mobility can be easily obtained. A thickness of the first film region 14a (a first film region thickness tr4a (see FIG. 1)) is, for example, not less than 100 nm and not more than 3000 nm. A thickness of the second film region 14b (a second film region thickness tr4b (see FIG. 1)) is, for example, not less than 50 nm and no more than 2000 nm.

The fifth nitride region 15 includes $Al_{x5}Ga_{1-x5}N$ (0<x5≤1, x4<x5). The composition ratio x5 of Al in the fifth nitride region 15 is, for example, not less than 0.05 and not more than 0.35. The fifth nitride region 15 is, for example, AlGaN. A thickness of the fifth nitride region 15 (a fifth nitride region thickness tr5 (see FIG. 1)) is, for example, not less than 15 nm and not more than 50 nm. The second nitride region 12 is between the first nitride region 11 and the fifth nitride region 15. The third nitride region 13 is between the second nitride region 12 and the fifth nitride region 15. The fourth nitride region 14 is between the third nitride region 13 and the fifth nitride region 15. The fourth nitride region 14 is between the second nitride region 12 and the fifth nitride region 15.

For example, a carrier region is formed in a portion of the fourth nitride region 14 facing the fifth nitride region 15. The carrier region is, for example, a two-dimensional electron gas.

In a semiconductor device based on the nitride semiconductor 110, the carrier region is used for the operation of the semiconductor device.

The nitride member 10M is formed by a MOCVD (metal organic chemical vapor deposition) method or the like using, for example, a raw material gas including a group III element (Al or Ga) and a raw material gas including a group V element (N), for example.

Figure 4:
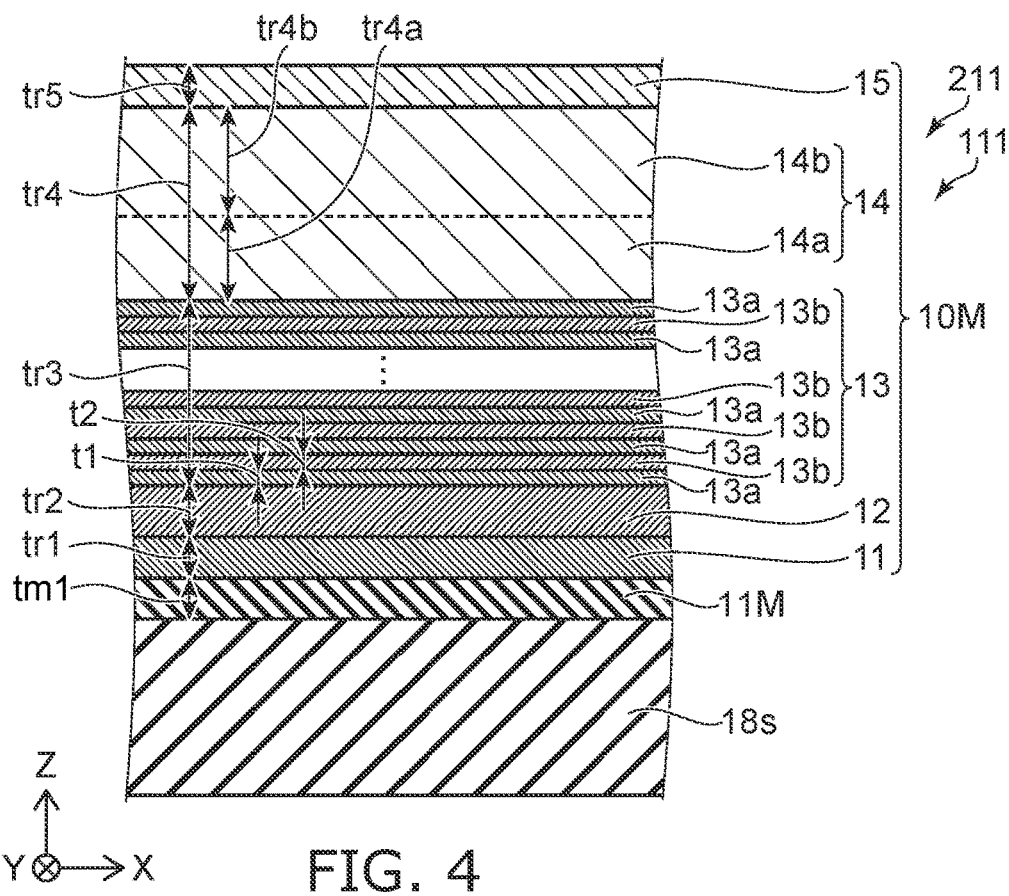
FIG. 4 is a schematic cross-sectional view illustrating a nitride semiconductor according to the first embodiment.

FIG. 4 is a schematic cross-sectional view illustrating a nitride semiconductor according to the first embodiment.

As shown in FIG. 4, in a nitride semiconductor 111 and a wafer 211 according to the embodiment, the third nitride region 13 has a stacked structure.

For example, the third nitride region 13 includes a plurality of first regions 13a and a plurality of second regions 13b. In the first direction (the Z-axis direction) from the first nitride region 11 to the second nitride region 12, one of the plurality of first regions 13a is located between one of the plurality of second regions 13b and another one of the plurality of second regions 13b. The one of the plurality of second regions 13b is located between the one of the plurality of first regions 13a and another one of the plurality of first regions 13a. For example, the first region 13a and the second region 13b are alternately provided along the Z-axis direction.

The first region 13a includes $Al_{y1}Ga_{1-y1}N$ (0<y1≤1). The second region 13b includes $Al_{y2}Ga_{1-y2}N$ (0≤y2<y1).

The Al composition ratio (a composition ratio y1) in the first region 13a is, for example, not less than 0.75 and not more than 1. In one example, the first region 13a is AlN.

The Al composition ratio (a composition ratio y2) in the second region 13b is, for example, not less than 0.06 and not more than 0.3. In one example, the second region 13b is $Al_{0.13}Ga_{0.87}N$.

In one example, the composition ratio y1 is not more than the composition ratio x1. In one example, the composition ratio y2 is higher than the composition ratio x2.

For example, one of the plurality of first regions 13a may be in contact with the second nitride region 12. For example, one of the plurality of second regions 13b may be in contact with the second nitride region 12. For example, one of the plurality of first regions 13a may be in contact with the fourth nitride region 14. For example, one of the plurality of second regions 13b may be in contact with the fourth nitride region 14. The plurality of first regions 13a and the plurality of second regions 13b may form, for example, a superlattice structure. The absolute value of the difference between the number of the plurality of first regions 13a and the number of the plurality of second regions 13b may be 0 or 1. The number of the plurality of first regions 13a is, for example, not less than 10 and not more than 200. One of the plurality of first regions 13a may be regarded as the second nitride region 12.

Each of the plurality of first regions 13a has a first region thickness t1 along the first direction (the Z-axis direction). For example, the first region thickness t1 is thinner than the second nitride region thickness tr2 along the first direction of the second nitride region 12. Each of the plurality of second regions 13b has a second region thickness t2 along the first direction. For example, the second region thickness t2 is thinner than the second nitride region thickness tr2. For example, the first region thickness t1 is thinner than the second region thickness t2.

For example, the thickness t1 of the first region along the first direction of each of the plurality of first regions 13a is thinner than the thickness tr1 of the first nitride region along the first direction of the first nitride region 11. The second region thickness t2 along the first direction of each of the plurality of second regions 13b is thinner than the first nitride region thickness tr1.

The region thickness t1 is, for example, not less than 3 nm and not more than 10 nm. In one example, the first region thickness t1 is 5 nm. The second region thickness t2 is, for example, not less than 15 nm and not more than 40 nm. In one example, the second region thickness t2 is 25 nm.

In the third nitride region 13 having such a structure, for example, at the interface between the first region 13a and the second region 13b, dislocations tend to bend. It is easy to obtain a lower dislocation density. By providing a plurality of regions having different Al composition ratio, for example, high breakdown voltage can be easily obtained.

Hereinafter, an example of a method for manufacturing the nitride semiconductor 111 (wafer 211) will be described.

The base body 18s is treated by organic cleaning and acid cleaning. The base body 18s is introduced into an MOCVD apparatus. The surface of the base body 18s is heat treated at 1000° C. in a hydrogen atmosphere. By the heat treatment, for example, an oxide film on the surface of the base body 18s is removed.

After that, the intermediate region 11M is formed. For example, at 580° C., a first gas including carbon is supplied. As a result, carbon adheres to the surface of the base body 18s. The first gas including carbon includes, for example, trimethylaluminum (TMAI). The first gas including carbon may include, for example, a hydrocarbon gas such as acetylene or ethylene. After that, the supply of the first gas including carbon is stopped.

After that, a second gas including nitrogen is supplied. The second gas includes, for example, ammonia ($NH_3$). In supplying the second gas, the temperature is changed, for example, from 580° C. to 1040° C. By supplying the second gas, the intermediate region 11M is formed.

The concentration of carbon C (C) in the intermediate region 11M can be controlled by, for example, the supply amount of the first gas including carbon (for example, partial pressure) or the supply time of the first gas. The concentration of carbon C (C) in the intermediate region 11M may be controlled by the temperature of the base body 18s. For example, by increasing the supply amount of the first gas, the concentration of carbon C (C) in the intermediate region 11M increases. By increasing the supply time of the first gas, the concentration of carbon C (C) in the intermediate region 11M increases. When the temperature of the base body 18s is low, the concentration of carbon C (C) in the intermediate region 11M increases. In the forming the intermediate region 11M, the temperature of the base body 18s when the second gas is supplied is, for example, not less than 550° C. and not more than 800° C.

After the above supply of the second gas, the first nitride region 11 is formed. For example, an AlN layer served as the first nitride region 11 is formed at 1040° C. by using TMAI and $NH_3$. The thickness of the first nitride region 11 (the first nitride region thickness tr1) is, for example, 150 nm (for example, not less than 5 nm and not more than 500 nm). For example, the first nitride region 11 does not include carbon. For example, the concentration of carbon in the first nitride region 11 is lower than the concentration of carbon in the intermediate region 11M. For example, the ratio of the concentration of carbon in the first nitride region 11 to the concentration of carbon in the intermediate region 11M is not more than 0.05. For example, the ratio of the concentration of carbon in the first nitride region 11 to the concentration of carbon in the intermediate region 11M may be not less than 0.0001. For example, the oxygen concentration in the first nitride region 11 is lower than the oxygen concentration in the intermediate region 11M. For example, the ratio of the oxygen concentration in the first nitride region 11 to the oxygen concentration in the intermediate region 11M is not more than 0.05. The ratio of the oxygen concentration in the first nitride region 11 to the oxygen concentration in the intermediate region 11M may be not less than 0.0001.

After that, the second nitride region 12 is formed. For example, an AlGaN layer served as at least part of the second nitride region 12 is formed at 960° C. by using TMAI, trimethylgallium (TMGa) and ammonia. The AlGaN layer is, for example, a carbon-doped $Al_{0.12}Ga_{0.88}N$ layer. The thickness of the second nitride region 12 (the second nitride region thickness tr2) is, for example, 250 nm (for example, not less than 50 nm and not more than 2000 nm). The concentration of carbon C (C) in the second nitride region 12 is, for example, $4.0\times10^{18}/cm^3$. The oxygen concentration in the second nitride region 12 is, for example, $7.9\times10^{15}/cm^3$. For example, the concentration of carbon in the second nitride region 12 is lower than the concentration of carbon in the intermediate region 11M. For example, the concentration of carbon in the second nitride region 12 is higher than the concentration of carbon in the first nitride region 11. For example, the oxygen concentration in the second nitride region 12 is lower than the oxygen concentration in the intermediate region 11M. For example, the oxygen concentration in the second nitride region 12 is lower than the oxygen concentration in the first nitride region 11.

After that, the third nitride region 13 is formed. For example, the third nitride region 13 includes a plurality of first regions 13a and a plurality of second regions 13b. For example, an AlN layer served as the first region 13a is formed in an atmosphere including nitrogen and hydrogen using TMAI and ammonia. The temperature at which the first region 13a is formed is, for example, 940° C. The thickness of the first region 13a (the first region thickness t1) is, for example, 5 nm (for example, not less than 2 nm and not more than 15 nm).

On the first region 13a, an $Al_{0.13}Ga_{0.87}N$ layer serves as the second region 13b is formed using TMAI, TMGa and ammonia. The temperature at which the second region 13b is formed is, for example, 940° C. The thickness of the second region 13b (the second region thickness t2) is, for example, 25 nm (for example, not less than 15 nm and not more than 40 nm). The forming the first region 13a and the formation of the second region 13b are repeated 125 times in total. A first region 13a is further formed on the last second region 13b. As a result, the third nitride region 13 is formed.

The concentration of carbon in the third nitride region 13 is, for example, $1.5\times10^{19}/cm^3$ (for example, not less than $5\times10^{18}/cm^3$ and not more than $9\times10^{19}/cm^3$). The oxygen concentration in the third nitride region 13 is, for example, $3.9\times10^{16}/cm^3$ (for example, not less than $5\times10^{15}/cm^3$ and not more than $1\times10^{17}/cm^3$). For example, the concentration of carbon in the third nitride region 13 is higher than the concentration of carbon in the intermediate region 11M. For example, the oxygen concentration in the third nitride region 13 is higher than the oxygen concentration in the intermediate region 11M. For example, the concentration of carbon in the third nitride region 13 is higher than the concentration of carbon in the second nitride region 12. For example, the oxygen concentration in the third nitride region 13 is higher than the oxygen concentration in the second nitride region 12. For example, the concentration of carbon in the third nitride region 13 is higher than the concentration of carbon in the first nitride region 11. For example, the oxygen concentration in the third nitride region 13 is lower than the oxygen concentration in the first nitride region 11.

After that, the temperature of the base body 18s is set to, for example, 940° C., and the first film region 14a is formed in a hydrogen atmosphere using TMGa and ammonia. The first film region 14a is, for example, a GaN layer. The first film region 14a includes carbon. The thickness of the first film region 14a is, for example, 1000 nm (for example, not less than 600 nm and not more than 3000 nm). The concentration of carbon in the first film region 14a is, for example, $3\times10^{19}/cm^3$ (for example, not less than $5\times10^{18}/cm^3$ and not more than $9\times10^{19}/cm^3$).

After that, the temperature of the base body 18s is set to, for example, 1040° C., the second film region 14b is formed using TMGa and ammonia. The second film region 14b is, for example, an undoped GaN layer. The thickness of the second film region 14b is, for example, 500 nm (for example, not less than 50 nm and not more than 2000 nm).

After that, the temperature of the base body 18s is set to, for example, 1020° C., and the fifth nitride region 15 is formed using TMGa, TMAl and ammonia. The fifth nitride region 15 is, for example, an undoped $Al_{0.2}Ga_{0.8}N$ layer. The thickness of the fifth nitride region 15 is, for example, 30 nm (for example, not less than 15 nm and not more than 50 nm).

The first film region 14a, the second film region 14b, and the fifth nitride region 15 become a part of the functional layer.

Second Embodiment

The second embodiment relates to a semiconductor device.

Figure 5:
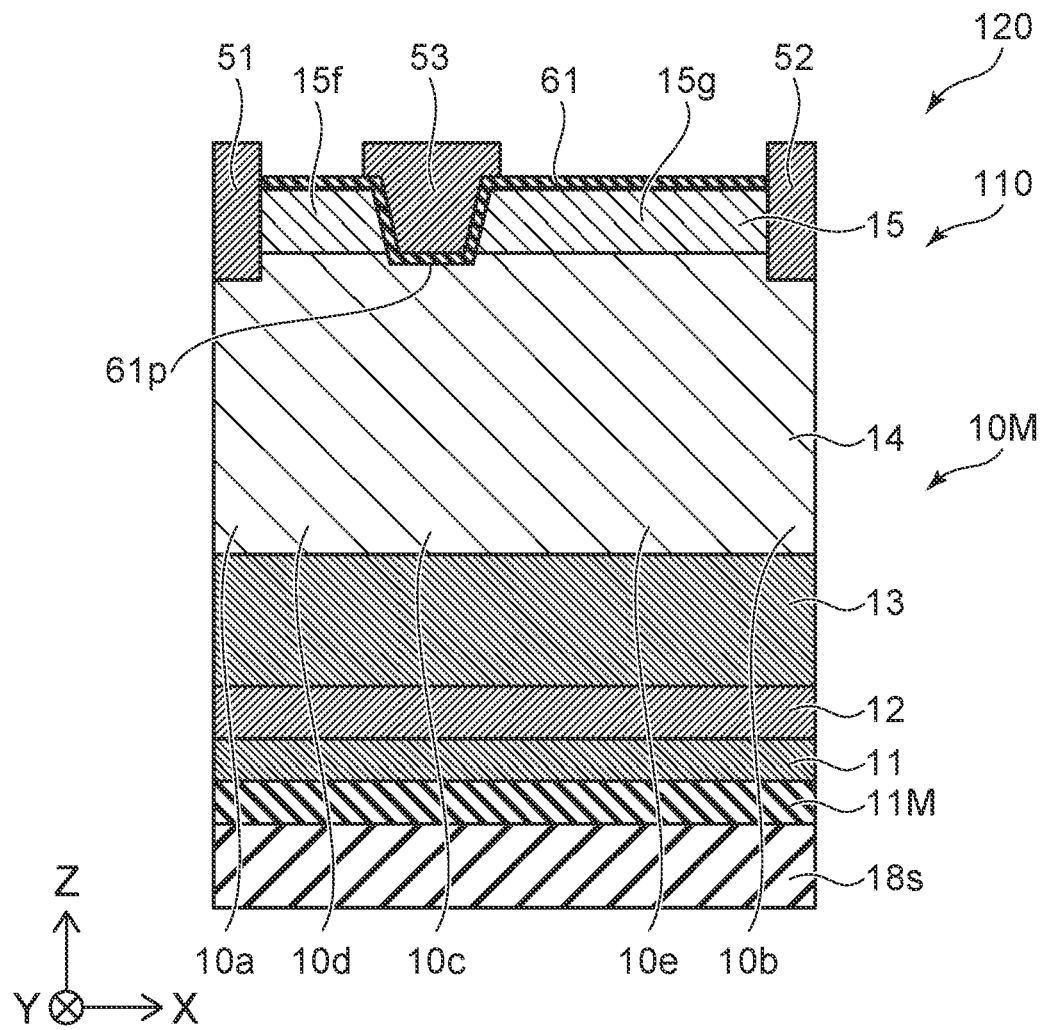
FIG. 5 is a schematic cross-sectional view illustrating a semiconductor device according to a second embodiment.

FIG. 5 is a schematic cross-sectional view illustrating a semiconductor device according to the second embodiment.

As shown in FIG. 5, a semiconductor device 120 according to the embodiment includes a nitride semiconductor (in this example, a nitride semiconductor 110) according to the first embodiment, a first electrode 51, a second electrode 52, a second electrode, and an insulating member 61.

A direction from the first electrode 51 to the second electrode 52 is along a second direction crossing the first direction (the Z-axis direction). The second direction is, for example, the X-axis direction. A position of the third electrode 53 in the second direction is between a position of the first electrode 51 in the second direction and a position of the second electrode 52 in the second direction.

The nitride member 10M includes first to fifth nitride regions 11 to 15. The fourth nitride region 14 includes a first partial region 10a, a second partial region 10b, a third partial region 10c, a fourth partial region 10d, and a fifth partial region 10e. A direction from the first partial region 10a to the first electrode 51 is along the first direction (the Z-axis direction). A direction from the second partial region 10b to the second electrode 52 is along the first direction. The third partial region 10c is between the first partial region 10a and the second partial region 10b in the second direction (the X-axis direction). A direction from the third partial region 10c to the third electrode 53 is along the first direction. The fourth partial region 10d is between the first partial region 10a and the third partial region 10c in the second direction. The fifth partial region 10e is between the third partial region 10c and the second partial region 10b in the second direction.

The fifth nitride region 15 includes a sixth partial region 15f and a seventh partial region 15g. The direction from the fourth partial region 10d to the sixth partial region 15f is along the first direction (the Z-axis direction). A direction from the fifth partial region 10e to the seventh partial region 15g is along the first direction.

The insulating member 61 is located between the nitride member 10M and the third electrode 53. For example, the insulating member 61 includes a first insulating region 61p. The first insulating region 61p is provided between the third partial region 10c and the third electrode 53 in the first direction (Z-axis direction).

The semiconductor device 120 may include the nitride semiconductor 111. In the semiconductor device 120, a current flowing between the first electrode 51 and the second electrode 52 can be controlled by a potential of the third electrode 53. The potential of the third electrode 53 is, for example, a potential based on a potential of the first electrode 51. The first electrode 51 functions as, for example, a source electrode. The second electrode 52 functions as, for example, a drain electrode. The third electrode 53 functions as, for example, a gate electrode. In one example, the semiconductor device 120 is a HEMT (High Electron Mobility Transistor). According to the embodiment, it is possible to provide a semiconductor device whose characteristics can be improved.

In the semiconductor device 120, at least a part of the third electrode 53 is between the sixth partial region 15f and the seventh partial region 15g in the second direction (for example, the X-axis direction). At least a part of the third electrode 53 may be between the fourth partial region 10d and the fifth partial region 10e in the second direction (for example, the X-axis direction). The semiconductor device 120 is, for example, of a normally-off type.

Figure 6:
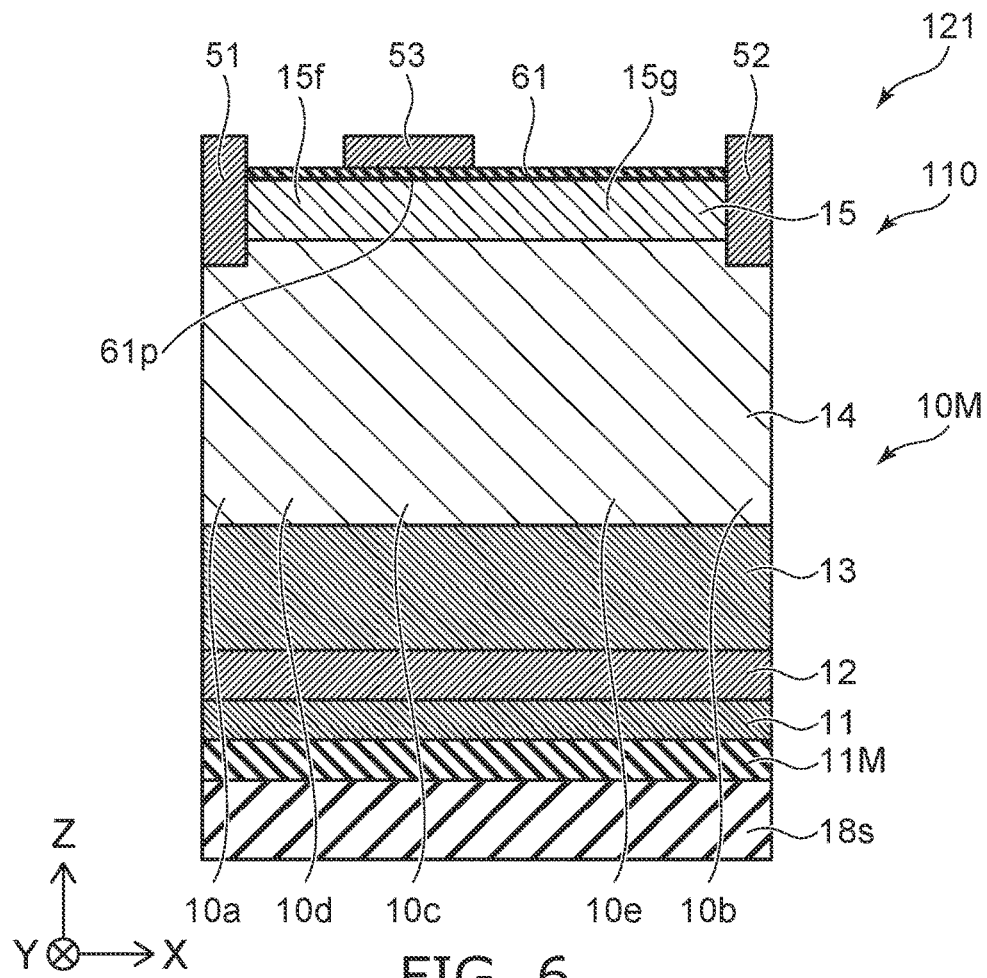
FIG. 6 is a schematic cross-sectional view illustrating a semiconductor device according to the second embodiment.

FIG. 6 is a schematic cross-sectional view illustrating a semiconductor device according to the second embodiment.

As shown in FIG. 6, a semiconductor device 121 according to the first embodiment includes the nitride semiconductor (in this example, the nitride semiconductor 110) according to the first embodiment, the first electrode 51, the second electrode 52, and the third electrodes 53 and the insulating member 61. In the semiconductor device 121, the third electrode 53 does not overlap the sixth partial region 15f and the seventh partial region 15g in the second direction (for example, the X-axis direction). The third electrode 53 does not overlap the fourth partial region 10d and the fifth partial region 10e in the second direction (for example, the X-axis direction). The semiconductor device 121 is, for example, of a normally-on type.

Third Embodiment

The third embodiment relates to a method for manufacturing a nitride semiconductor. The method for manufacturing a nitride semiconductor according to the third embodiment may be applied to a method for manufacturing a wafer or a method for manufacturing a semiconductor device.

Figure 7:
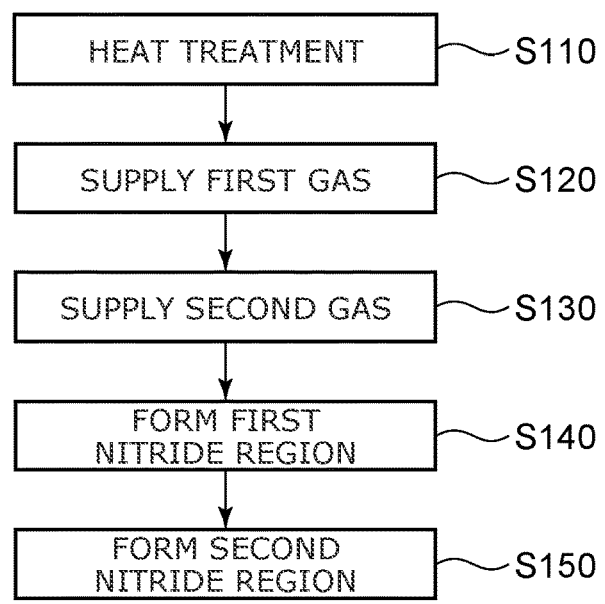
FIG. 7 is a flowchart illustrating a method for manufacturing the nitride semiconductor according to the third embodiment.

FIG. 7 is a flowchart illustrating a method for manufacturing a nitride semiconductor according to the third embodiment.

As shown in FIG. 7, in the method for producing a nitride semiconductor according to the embodiment, the first gas including carbon is supplied onto the base body 18s (step S120). After the supplying the first gas, the second gas including nitrogen is supplied (step S130). The first nitride region 11 including $Al_{x1}Ga_{1-x1}N$ ($0<x1\leq1$) is formed on the base body 18s after the supplying the second gas (step S140). After forming the first nitride region 11, the second nitride region 12 including $Al_{x2}Ga_{1-x2}N$ ($0\leq x2<1$, $x2<x1$) is formed (step S150). The intermediate region 11M is formed by steps S110 and S120.

The intermediate region 11M between the base body 18s and the first nitride region 11 includes nitrogen and carbon. The concentration of carbon in the intermediate region 11M is not less than $1.5\times10^{19}/cm^3$ and not more than $6\times10^{20}/cm^3$. Warpage can be suppressed.

For example, the first gas is not supplied in at least a part of the supplying the second gas. For example, the supplying the first gas is stopped and the second gas including nitrogen is supplied (step S130). As a result, the intermediate region 11M being intended can be stably formed. The base body 18s may be heat treated prior to the supplying the first gas (step S110). As a result, an unnecessary layer (for example, a silicon oxide layer) on the surface of the base body 18s is removed. Oxygen included in the intermediate region 11M can be reduced. As a result, the intermediate region 11M being intended can be stably formed.

For example, the first gas includes aluminum and carbon. For example, the second gas includes ammonia. For example, the first gas may include carbon and hydrogen. For example, the second gas may include nitrogen.

In the embodiment, information on the structure of the nitride region and the like can be obtained by, for example, electron microscope observation. Information on the composition and element concentration in the nitride region can be obtained by, for example, EDX (Energy Dispersive X-ray Spectroscopy) or SIMS (Secondary Ion Mass Spectrometry). Information on the composition in the nitride region may be obtained, for example, by X-ray reciprocal lattice space mapping.

According to the embodiment, it is possible to provide a nitride semiconductor, a semiconductor device, and a method for manufacturing a nitride semiconductor capable of suppressing warpage.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in nitride semiconductor such as nitride members, nitride region, base body, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all nitride semiconductors, semiconductor devices, and methods for manufacturing nitride semiconductors practicable by an appropriate design modification by one skilled in the art based on the nitride semiconductors, the semiconductor devices, and the methods for manufacturing nitride semiconductors described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A nitride semiconductor, comprising:
a base body;
a nitride member; and
an intermediate region provided between the base body and the nitride member,
the nitride member including,
a first nitride region including $Al_{x1}Ga_{1-x1}N$ ($0<x1\le1$), and
a second nitride region including $Al_{x2}Ga_{1-x2}N$ ($0\le x2<1$, $x2<x1$),
the first nitride region being between the intermediate region and the second nitride region,
the intermediate region including nitrogen and carbon,
a concentration of carbon in the intermediate region being not less than $1.5\times10^{19}/cm^3$ and not more than $6\times10^{20}/cm^3$.

2. The semiconductor according to claim 1, wherein the intermediate region is in contact with the base body.

3. The semiconductor according to claim 2, wherein the intermediate region is in contact with the first nitride region.

4. The semiconductor according to claim 3, wherein the first nitride region is in contact with the second nitride region.

5. The semiconductor according to claim 1, wherein at least a part of the intermediate region includes aluminum.

6. The semiconductor according to claim 1, wherein at least a part of the intermediate region includes silicon.

7. The semiconductor according to claim 1, wherein the first nitride region includes AlN.

8. The semiconductor according to claim 1, wherein the base body includes silicon.

9. The semiconductor according to claim 1, wherein the concentration of carbon in the intermediate region is not less than $3\times10^{19}/cm^3$ and not more than $4\times10^{20}/cm^3$.

10. The semiconductor according to claim 1, wherein the first nitride region does not include carbon, or a concentration of carbon in the first nitride region is lower than the concentration of the carbon in the intermediate region.

11. The semiconductor according to claim 10, wherein
the second nitride region includes carbon, and
a concentration of carbon in the second nitride region is higher than the concentration of carbon in the first nitride region.

12. The semiconductor according to claim 11, wherein the concentration of carbon in the second nitride region is lower than the concentration of carbon in the intermediate region.

13. The semiconductor according to claim 1, wherein
the nitride member further includes a third nitride region including $Al_{x3}Ga_{1-x3}N$ ($0\le x3\le1$),
the second nitride region is between the first nitride region and the third nitride region.

14. The semiconductor according to claim 13, wherein
the third nitride region includes a plurality of first regions and a plurality of second regions,
one of the first regions is between one of the second regions and an other one of the second regions in a first direction from the first nitride region to the second nitride region,
the one of the second regions is between the one of the first regions and an other one of the first regions,
the first regions include $Al_{y1}Ga_{1-y1}N$ ($0<y1\le1$), and
the second regions include $Al_{y2}Ga_{1-y2}N$ ($0\le y2<y1$).

15. The semiconductor according to claim 1, wherein
the nitride member further includes;
a fourth nitride region including $Al_{x4}Ga_{1-x4}N$ ($0\le x4<1$); and
a fifth nitride region including $Al_{x5}Ga_{1-x5}N$ ($0<x5\le1$, $x4<x5$), and
the fourth nitride region is between the second nitride region and the fifth nitride region.

16. A semiconductor device, comprising
the nitride semiconductor according to claim 15;
a first electrode;
a second electrode;
a third electrode; and
an insulating member,
a direction from the first electrode to the second electrode being along a second direction crossing a direction from the first nitride region to the second nitride region,
a position of the third electrode in the second direction being between a position of the first electrode in the second direction and a position of the second electrode in the second direction,
the fourth nitride region including a first partial region, a second partial region, a third partial region, a fourth partial region, and a fifth partial region,
a direction from the first partial region to the first electrode being along the first direction,
a direction from the second partial region to the second electrode being along the first direction,
the third partial region being located between the first partial region and the second partial region in the second direction,
a direction from the third partial region to the third electrode being along the first direction,
the fourth partial region being between the first partial region and the third partial region in the second direction,
the fifth partial region being located between the third partial region and the second partial region in the second direction,
the fifth nitride region including a sixth partial region and a seventh partial region,
the direction from the fourth partial region to the sixth partial region being along the first direction,
a direction from the fifth partial region to the seventh partial region being along the first direction,
the insulating member being between the nitride member and the third electrode.

17. A method for manufacturing a nitride semiconductor, comprising:
supplying a first gas including carbon on a base body;
stopping the supplying the first gas;
supplying a second gas including nitrogen;
forming a first nitride region including $Al_{x1}Ga_{1-x1}N$ ($0<x1\leq1$) on the base body after the supplying of the second gas; and
forming a second nitride region including $Al_{x2}Ga_{1-x2}N$ ($0\leq x2<1$, $x2<x1$) after the forming the first nitride region.

18. The method according to claim 17, wherein
an intermediate region between the base body and the first nitride region includes nitrogen and carbon, and
a concentration of carbon in the intermediate region is not less than $1.5\times10^{19}/cm^3$ and not more than $6\times10^{20}/cm^3$.

19. The method according to claim 17, wherein
the first gas includes aluminum and carbon, and
the second gas includes ammonia.

20. The method according to claim 17, wherein
the first gas includes hydrocarbon, and
the second gas includes ammonia.

* * * * *